United States Patent
Du

(10) Patent No.: US 7,759,258 B2
(45) Date of Patent: Jul. 20, 2010

(54) METHOD FOR MAKING SOLAR CELL

(75) Inventor: Chen-Hsun Du, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/319,455

(22) Filed: Dec. 29, 2005

(65) Prior Publication Data

US 2007/0151944 A1    Jul. 5, 2007

(30) Foreign Application Priority Data

Dec. 31, 2004   (TW) ............................... 93141882 A

(51) Int. Cl.
*H01L 21/302* (2006.01)

(52) U.S. Cl. .................. 438/753; 438/745; 438/752; 216/99

(58) Field of Classification Search .............. 438/745, 438/750, 752, 753; 216/13, 83, 99, 106; 252/79.1, 2

See application file for complete search history.

(56) References Cited

U.S. PATENT DOCUMENTS

| | | | | |
|---|---|---|---|---|
| 4,230,522 A * | 10/1980 | Martin et al. | ............... | 438/669 |
| 5,011,565 A * | 4/1991 | Dube et al. | ................... | 438/98 |
| 5,964,953 A * | 10/1999 | Mettifogo | ....................... | 134/2 |
| 6,340,640 B1 * | 1/2002 | Nishimoto et al. | .......... | 438/753 |
| 6,656,852 B2 * | 12/2003 | Rotondaro et al. | .......... | 438/749 |
| 2006/0040838 A1 * | 2/2006 | Shimada et al. | ............ | 510/175 |

* cited by examiner

*Primary Examiner*—Lan Vinh
(74) *Attorney, Agent, or Firm*—Birch, Stewart, Kolasch & Birch, LLP

(57) ABSTRACT

A surface texturization process for a silicon wafer, which is applied to a method for making a solar cell, is provided. The surface texturization process substantially comprises: 1) providing an acidic mixed solution; 2) immersing the silicon wafer in the acidic mixed solution; and 3) etching the acidic mixed solution for a predetermined time section. The mixed acidic solution includes nitric acid and ammonium fluoride and a predetermined mixture selecting from the group consisting of phosphoric acid, sulfuric acid or acetic acid.

7 Claims, 4 Drawing Sheets

METHOD FOR MAKING SOLAR CELL

BACKGROUND OF THE INVENTION (1) Field of the Invention

The present invention generally relates to a method for making solar cell, and more particularly to a surface texturization process toward a silicon wafer of the solar cell.

(2) Description of the Prior Art

Typical method for making solar cell usually comprises a surface texturization process to enhance texturized (or roughness) level of the surface of the solar cell. The surface texturization process is generally for enlarging the surface square measure of the solar cell to increase the absorbed light and to raise the photo-electricity conversion efficiency.

Prior solar cell made from monocrystalline silicon is usually texturized by utilizing alkaline solution such as potassium hydroxide (KOH) solution or sodium hydroxide (NaOH) solution. Anisotropic etching is proceeded on the solar cell's surface by using these alkaline solutions. However, while applying such method to the solar cell made from multicrystalline silicon, several problems arise:

1. Because the original crystal surface of multicrystalline silicon is not <100> orientation surface, Pyramid like microstructure will not be formed on the surface after etching. This is unfavorable for light absorbing.

2. Because the original surface of multicrystalline silicon comprises various orientations of crystalline grain having different etching rate. Somehow, fault structures between these different orientations of crystalline grain will be formed after etching. As a result, the fault structure would result in electrically disconnection, or resistance increasing of solar cell interconnection.

To resolve the mentioned drawbacks, surface texturization process utilizing isotropic etching is adopted. This kind of surface texturization process is substantially divided into two category: 1) Dry etching; and 2) Utilizing acidic solution for etching. The present invention generally relates to the latter one. About utilizing acidic solution for etching, there are several typical prior arts:

1. Please refer to patents occupied by Mitsubishi Denki Kabushiki Kaisha (Tokyo, Japan): U.S. Pat. Nos. 6,156,968, 6,391,145, 6,340,640 and JP10-303443. These patents generally disclose utilizing mixed solution of nitric acid, hydrofluoric acid and at least one "carboxylic acid, which has a molecular weight more weighting than acetic acid" and "mixed solution of phosphoric ace and carboxylic acid having a molecular weight more weighting than acetic acid" for surface texturization process. After etching, diluted sodium hydroxide is needed for removing the formed compound from the process. Within these patents, the U.S. Pat. No. 6,156,968 relates to the etching structured of the solar cell; the U.S. Pat. No. 6,340,640 and the JP10-303443 relate to the etching process; and the U.S. Pat. No. 6,391,145 relates to the apparatus for the etching process.

2. Please refer to patents occupied by Photowatt International S.A. (Bourgoin-Jallieu, France): U.S. Pat. No. 5,646,123 and JP9-167850. These patents generally disclose utilizing a two-stages process to texturize the surface of solar cell made from p-typed poly silicon. The first stage is oxidizing the surface of solar cell by an oxidizing solution containing fluorine ion to make the surface a porous layer. The second stage is dissolving the oxidized porous layer by a dissolving solution to reveal a texturized surface cratered with cavities of depth and diameter lying in the range of 0.10 .mu.m to 10 .mu.m. The oxidizing solution in the first stage is selected from the chromate ion, the bromate ion, the nitrate ion, the nitrite ion, the amine ion, a metallic redox couple, and mixtures thereof. The dissolving solution in the second stage is an alkaline solution.

3. Please refer to patents occupied by SHINRYO CORP (Japan): JP2004-063744. The patent discloses an etching method has a first process for immersing the unprocessed silicon substrate in mixed acid water solution A comprising 36 weight % to 42 weight % of hydrofluoric acid and 6 weight % to 10 weight % of nitric acid and etching the substrate, and a second process for immersing the silicon substrate etched in the first process in mixed acid water solution B comprising 42 weight % to 46 weight % of hydrofluoric acid and 2 weight % to 6 weight % of nitric acid and etching the substrate. The first process is for forming a plurality of convex-concave structure on the solar cell's surface. The second process is for forming a plurality of micro convex-concave structure on the convex-concave structure. The mixed acid water solution A further comprises 1 weight % to 10 weight % acetic acid. The mixed acid water solution B further comprises 1 weight % to 5 weight % acetic acid.

4. Please refer to patents occupied by Mitsubishi Denki Kabushiki Kaisha (Tokyo, Japan): JP2000-323736. The patent discloses forming a Saw damage layer on the solar cell by utilizing isotropic etching solution, then utilizing spin etcher and mixed solution of nitric acid and hydrofluoric acid to from convex-concave structures.

The listed typical prior arts are all belonging to the category of utilizing acidic solution for etching. Almost all of them require hydrofluoric acid. Although these prior arts is capable of providing usable surface texturized structure, however, the process comprising using hydrofluoric acid is extremely dangerous, hazardous for environment and difficult to management. In anther aspect, these prior arts need alkaline solution to remove the formed compound from etching, or they have to divide into two stages. This is another inconvenience.

SUMMARY OF THE INVENTION

An objective of the present invention is to provide a method for making solar cell, especially a surface texturization process toward a silicon wafer of the solar cell.

Another objective of the present invention is to resolve the prior drawback of using hydrofluoric acid.

Another objective of the present invention is to provide a method for making solar cell, which is relatively stable and controllable and less hazardous for environment.

Another objective of the present invention is to provide a simplified method for making solar cell to avoid the prior two-stages process or to avoid using the alkaline solution, such as diluted sodium hydroxide, which is for removing the formed compound.

A method for making a solar cell is provided. One provided embodiment comprises steps S1 to S11. The step S1 is providing an acidic mixed solution. The step S2 is immersing a silicon wafer in the acidic mixed solution for etching. In the present invention. The step S3 is etching the silicon wafer by the acidic mixed solution for a predetermined time section. The steps S1 to S3 are belonging to the surface texturization process. The mixed acidic solution includes nitric acid and ammonium fluoride and a predetermined mixture selecting from the group consisting of phosphoric acid, sulfuric acid or acetic acid.

The step S4 is removing the silicon wafer from the acidic mixed solution. The step S5 is flushing the silicon wafer with deionized water to remove the remaining acidic mixed solution. The step S6 is spin-drying the silicon wafer. These two steps (S5 and S6) are for cleaning the silicon wafer. The step S7 is disposing the silicon wafer into a furnace with high temperature and filling an predetermined gas comprising phosphorus into the furnace to doped the silicon wafer as a n-typed semiconductor. The step S8 is proceeding plasma bombardment on edge side of the silicon wafer, so as to make the front-side and backside of wafer is insulated. The step S9 is depositing an anti-reflection layer comprising silicon nitride on front-side of the silicon wafer. This step (S9) is proceeded to increase the light absorption of the silicon wafer. The step S10 is applying an electrode material to both of the front-side and the backside of the silicon wafer to forming electrodes. The final step S11 is sintering the silicon wafer to complete the process.

These and other objectives of the present invention will no doubt become obvious to those of ordinary skill in the art after reading the following detailed description of the preferred embodiment which is illustrated in the various figures and drawings.

BRIEF DESCRIPTION OF THE DRAWINGS

The present invention will now be specified with reference to its preferred embodiment illustrated in the drawings, in which.

DESCRIPTION OF THE PREFERRED EMBODIMENT

Figure 1:
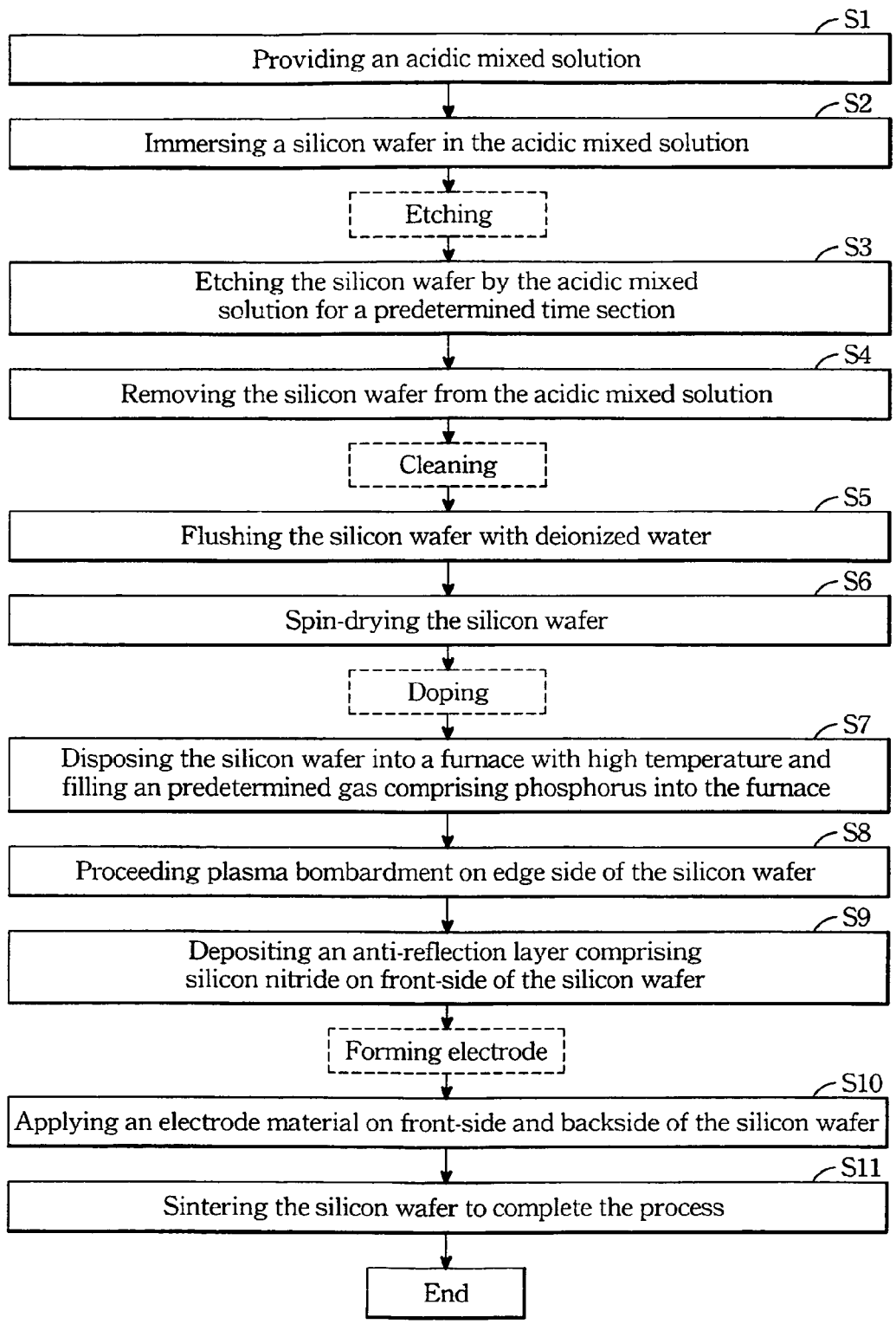
FIG. 1 shows a flow chart of the present invention.

Please refer to FIG. 1. It shows a flow chart of the present invention. The provided method for making a solar cell comprising the following steps. The step S1 is providing an acidic mixed solution. The step S2 is immersing a silicon wafer in the acidic mixed solution for etching. In the present invention, the silicon wafer is a p-typed silicon wafer. The step S3 is etching the silicon wafer by acidic mixed solution for a pre-determined time section. The predetermined time section ranges from 1 minute to 30 minutes. The steps S1 to S3 are belonging to the surface texturization process.

Following, the step S4 is removing the silicon wafer from the acidic mixed solution. The step S5 is flushing the silicon wafer with deionized water to remove the remaining acidic mixed solution. The step S6 is spin-drying the silicon wafer. These two steps (S5 and S6) are for cleaning the silicon wafer.

The following step is for doping the silicon wafer as n-type semiconductor. As shown in the flow chart, the step S7 is disposing the silicon wafer into a furnace with high temperature and filling an predetermined gas comprising phosphorus into the furnace to doped the silicon wafer as a n-type semi-conductor. The step S8 is proceeding plasma bombardment on edge side of the silicon wafer, so as to make front-side and backside of wafer is insulated. The step S9 is depositing an anti-reflection layer comprising silicon nitride (SiN) on front-side of the silicon wafer. This step (S9) is proceeded to increase the light absorption of the silicon wafer. The step S10 is applying an electrode material to both sides of the silicon wafer to forming electrodes. The final step S11 is sintering the silicon wafer to complete the process.

In several embodiments of the present invention, the acidic mixed solution, which is prepared in the step S1 for the surface texturization process, comprises nitric acid ($HNO_3$), about 40 weight % ammonium fluoride ($NH_4F$) and phosphoric acid ($H_3PO_4$). The volumetric proportion of the nitric acid to the ammonium fluoride and the phosphoric acid is 6:1:1.

A surface-active agent is also mixed with the acidic mixed solution in some embodiments to enhance texturized level of the surfaces of the silicon cell. The surface-active agent is selected from non-ionic surface-active agent, cation surface-active agent, anion surface-active agent or amphiprotic surface-active agent.

Figure 2:
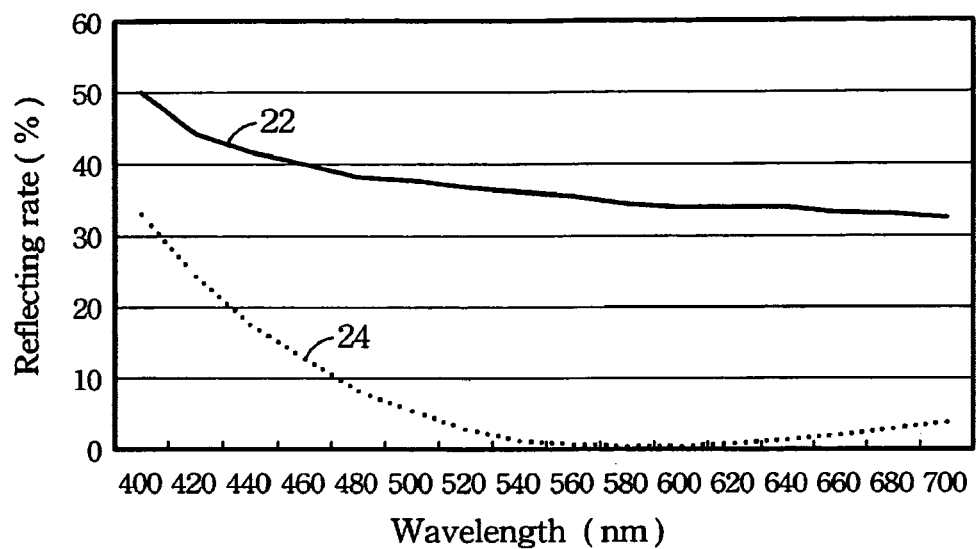
FIG. 2 is an optical wavelength to reflecting rate diagram according to one present embodiment.
Figure 3:
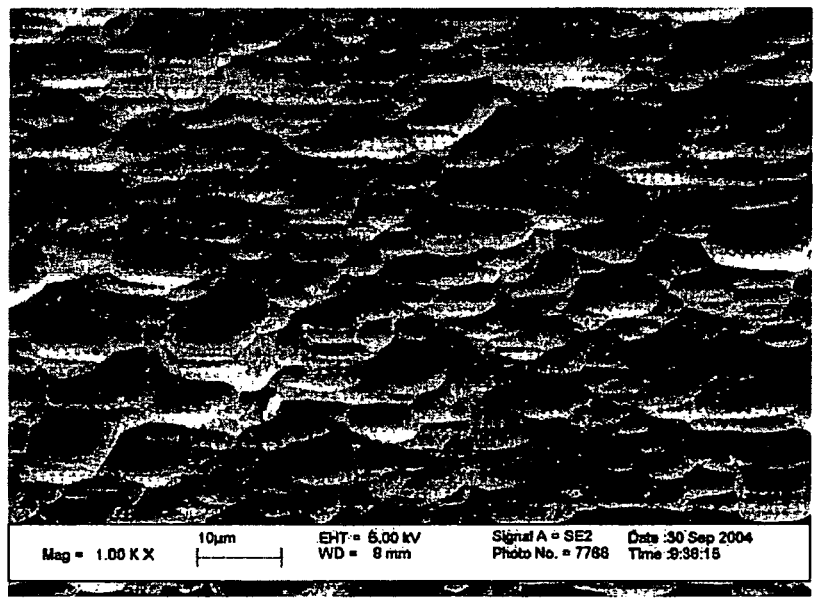
FIG. 3 is a picture taken by Scanning Electron Microscope (SEM), which shows the surface structure of a silicon wafer according to the same embodiment as FIG. 2.

Please refer to FIG. 2 and FIG. 3. FIG. 2 is an optical wavelength to reflecting rate diagram according to one present embodiment. FIG. 3 is a picture taken by Scanning Electron Microscope (SEM), which shows the surface structure of a silicon wafer according to the same embodiment as FIG. 2.

As shown in FIG. 2, line 22 presents the relationship between optical wavelength to reflectance according to a present solar cell, which is a silicon wafer without applied the anti-reflection layer mentioned in the step S9. It's reflectance generally ranges from 30% to 50%. Line 24 presents the relationship between optical wavelength to reflectance according to another present solar cell, which is made from the whole steps from S1 to S11. In other words, It comprises the anti-reflection layer. It's reflectance generally ranges from 0% to 35%, which is conformed to the demand of solar cell.

As shown in FIG. 3, the surface texturized structure of the present solar cell presents an even population, and it is of the suitable shape for increasing the surface square measure to increase the light absorption. No fault structure, which would result in disconnection, is formed between different orientations of crystalline grain. Substantially, the present invention has achieved a remarkable surface texturization result as same as the prior arts utilizing the hydrofluoric acid.

In another embodiments of the present invention, the acidic mixed solution, which is prepared in the step S1 for the surface texturization process, comprises nitric acid ($HNO_3$), about 40 weight % ammonium fluoride ($NH_4F$) and sulfuric acid ($H_2SO_4$). The volumetric proportion of the nitric acid to the ammonium fluoride and the sulfuric acid is 6:1:1.

A surface-active agent is also mixed with the acidic mixed solution in some embodiments to enhance texturized level of the surfaces of the silicon cell. The surface-active agent is selected from non-ionic surface-active agent, cation surface-active agent, anion surface-active agent or amphiprotic surface-active agent.

Figure 4:
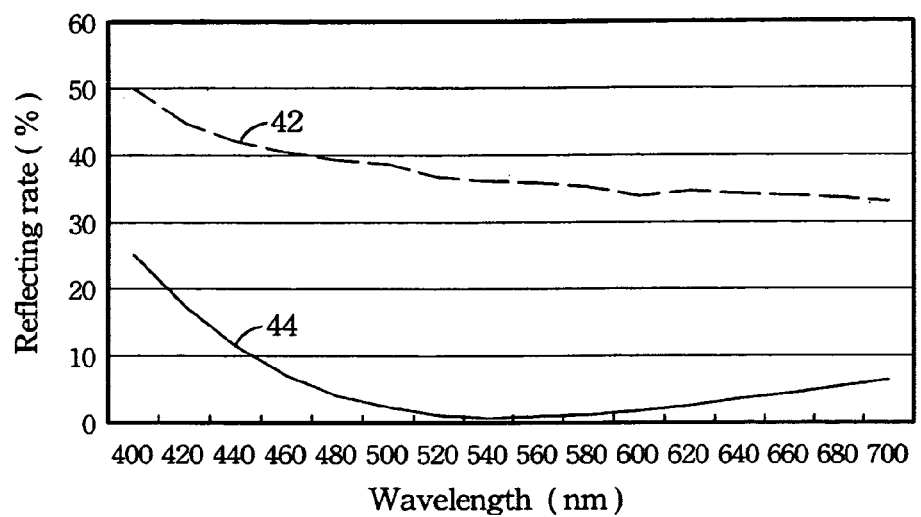
FIG. 4 is an optical wavelength to reflectance diagram according to another present embodiment.
Figure 5:
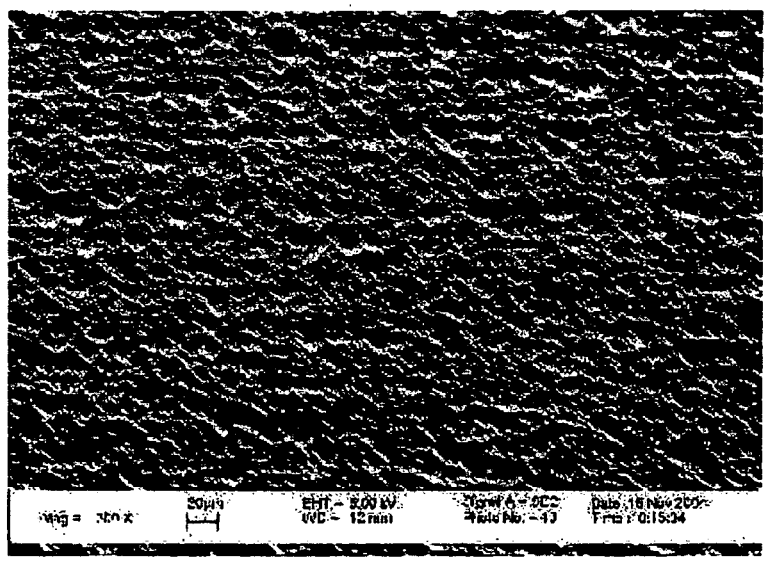
FIG. 5 is a picture taken by Scanning Electron Microscope (SEM), which shows the surface structure of a silicon wafer according to the same embodiment as FIG. 4.

Please refer to FIG. 4 and FIG. 5. FIG. 4 is an optical wavelength to reflecting rate diagram according to one present embodiment. FIG. 5 is a picture taken by Scanning Electron Microscope (SEM) according to the same embodiment as FIG. 4.

As shown in FIG. 4, line 42 presents the relationship between optical wavelength to reflectance according to a present solar cell, which is a silicon wafer without applied the anti-reflection layer mentioned in the step S9. It's reflectance generally ranges from 30% to 50%. Line 44 presents the relationship between optical wavelength to reflectance according to another present solar cell, which comprises the anti-reflection layer. It's reflecting rate generally ranges from 0% to 25%, being conformed to the demand of solar cell. and further exceeding the previous embodiment according FIG. 2.

As shown in FIG. 5, the surface texturized structure in this embodiment presents an even population, and it is of the suitable shape for increasing the surface square measure to increase the light absorption. Also, no fault structure, which would result in disconnection, is formed between different orientations of crystalline grain. Substantially, the present embodiment has achieved a remarkable surface texturization result as same as the prior arts utilizing the hydrofluoric acid.

Figure 6:
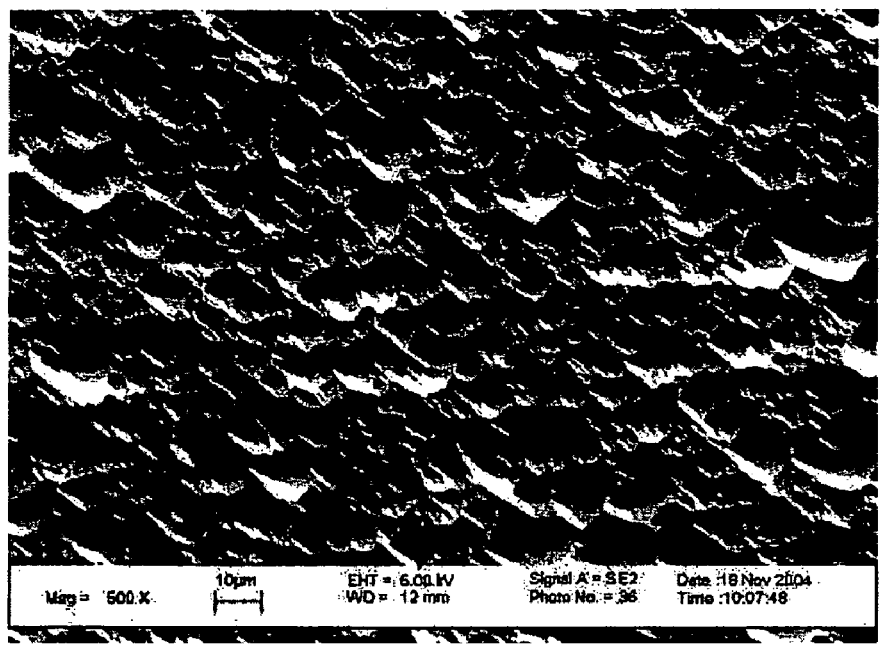
FIG. 6 is a picture taken by Scanning Electron Microscope (SEM), which shows the surface structure of a silicon wafer according to another embodiment.

Please refer to FIG. 6. It is a picture taken by SEM, which shows the surface structure of a silicon wafer according to another embodiment. This embodiment has very similar fabrication condition as the embodiment of FIG. 5. As shown, the surface texturization result is also very well. The scale bar of FIG. 5 is 10 micro-meter (μm); and the scale bar of FIG. 6 is 20 micro-meter (μm).

As mentioned, in some embodiments, the acidic mixed solution, which is prepared in the step S1, comprises nitric acid ($HNO_3$), about 40 weight % ammonium fluoride ($NH_4F$) and phosphoric acid ($H_3PO_4$). In another embodiments, sulfuric acid ($H_2SO_4$) is able to replace the phosphoric acid, which is also introduced before. And there is still another sort of embodiments. Acetic acid ($CH_3COOH$) is also able to used to replace the phosphoric acid or the sulfuric acid. Alternatively, the acidic mixed solution can comprise nitric acid, ammonium fluoride and a predetermined mixture selecting from the group consisting of phosphoric acid, sulfuric acid or acetic acid. The mixing proportion among the phosphoric acid, the sulfuric acid and the acetic acid can be modulated for controlling the etching speed or the texturized structure.

In view of the present invention, hydrofluoric acid according to prior arts is replaced with the present ammonium fluoride. Hence, a much more stable, controllable and environmental-friendly method for making solar cell is obtained. The present invention can meets the environment protective tendency and standards. A green solar cell is here provided. Through observation utilizing SEM, the structural achievement of the present invention is also remarkable. The surface texturization result is comparable with the prior arts utilizing hydrofluoric acid. Besides, the present invention needs no alkaline solution, such as diluted sodium hydroxide for cleaning the solar cell after etching. Requirement of two-stages process is able to be reduced to only one stage according to the present invention. Therefore, the advancement from the present invention is obvious.

With the example and explanations above, the features and spirits of the invention are hopefully well described. Those skilled in the art will readily observe that numerous modifications and alterations of the device may be made while retaining the teaching of the invention. Accordingly, the above disclosure should be construed as limited only by the metes and bounds of the appended claims.

I claim:

1. A surface texturization process for a bare silicon wafer without
   a texturized surface, which is applied to a method for making a solar cell, comprising: providing an acidic mixed solution;
   immersing the bare silicon wafer without a texturized surface into the acidic mixed solution; and
   etching the bare silicon wafer by the acidic mixed solution for a predetermined time section so as to texturize the surface of the bare silicon wafer,
   wherein the acidic mixed solution includes no hydrofluoric acid, but includes nitric acid and ammonium fluoride and a predetermined mixture selecting from the group consisting of phosphoric acid, sulfuric acid and acetic acid.

2. The surface texturization process according to claim 1, wherein the mixed acidic solution further includes a surface-activate agent.

3. The surface texturization process according to claim 2, wherein the surface-active agent is selected from the group consisting of non-ionic surface-active agent, cation surface-active agent, anion surface-active agent and amphiprotic surface-active agent.

4. A method for making a solar cell, comprising following steps:
   providing an acidic mixed solution;
   immersing bare silicon wafer without a texturized surface into the acidic mixed solution;
   etching the bare silicon wafer by the acidic mixed solution for a predetermined time section so as to texturize the surface of the bare silicon wafer;
   wherein the acidic mixed solution includes no hydrofluoric acid, but includes nitric acid and ammonium fluoride and a predetermined mixture selecting from the group consisting of phosphoric acid, sulfuric acid and acetic acid;
   removing a surface texturized silicon wafer from the acidic mixed solution;
   cleaning the surface texturized silicon wafer with deionized water;
   doping the surface texturized silicon wafer;
   insulating the front-side and backside of the surface texturized wafer;
   depositing an anti-reflection layer on front-side of the surface texturized silicon wafer;
   applying an electrode material to the front-side and backside of the surface texturized silicon wafer; and sintering the surface texturized silicon wafer to complete the solar cell.

5. The method for making a solar cell according to claim 4, wherein the mixed acidic solution further includes a surface-activate agent.

6. The method for making a solar cell according to claim 5, wherein the surface-active agent is selected from the group consisting of non-ionic surface-active agent, cation surface-active agent, anion surface-active agent and amphiprotic surface-active agent.

7. A surface texturization process for a bare silicon wafer, which is applied to a method for making a solar cell, comprising:
   providing an acidic mixed solution having; nitric acid: ammonium fluoride: phosphoric acid of 6:1:1;
   immersing the bare silicon wafer in the acidic mixed solution; and
   etching the bare silicon wafer by the acidic mixed solution for a predetermined time section.

* * * * *